US009367390B2

(12) United States Patent
Yeh (10) Patent No.: US 9,367,390 B2
(45) Date of Patent: Jun. 14, 2016

(54) MEMORY CONTROLLING METHOD, MEMORY STORAGE DEVICE AND MEMORY CONTROLLING CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 228 days.

(21) Appl. No.: 14/161,708

(22) Filed: Jan. 23, 2014

(65) Prior Publication Data
US 2015/0127885 A1 May 7, 2015

(30) Foreign Application Priority Data

Nov. 1, 2013 (TW) .............................. 102139739 A (51) Int. Cl.
*G06F 11/10* (2006.01)
*G11C 11/56* (2006.01)
*G06F 12/02* (2006.01)
*G06F 3/06* (2006.01)

(52) U.S. Cl.
CPC ........ *G06F 11/1048* (2013.01); *G11C 11/5628* (2013.01); *G06F 3/061* (2013.01); *G06F 12/0246* (2013.01)

(58) Field of Classification Search
CPC ..... G06F 12/0246; G06F 1/324; G06F 3/061; Y02B 60/1217
See application file for complete search history.

(56) References Cited

U.S. PATENT DOCUMENTS 8,301,833 B1    10/2012 Chen et al.
2008/0244299 A1*  10/2008 Tune ......................... G06F 5/06
                                                                   713/401

(Continued)

FOREIGN PATENT DOCUMENTS

WO        2013016723        1/2013

OTHER PUBLICATIONS

"Office Action of Taiwan Counterpart Application", issued on Jun. 8, 2015, p. 1-p. 9.

(Continued)

*Primary Examiner* — Ryan Bertram
(74) *Attorney, Agent, or Firm* — Jianq Chyun IP Office (57) ABSTRACT

A memory controlling method, a memory storage device and a memory controlling circuit unit are provided. The method includes: providing a first clock signal to a rewritable non-volatile memory module and reading a first data in the rewritable non-volatile memory module according to the first clock signal; providing a second clock signal to the rewritable non-volatile memory module and writing a second data into the rewritable non-volatile memory module according to the second clock signal. A frequency of the second clock signal is different from a frequency of the first clock signal. Accordingly, an operation speed of the rewritable non-volatile memory module may be increased and probabilities of having errors for some operations are decreased.

26 Claims, 5 Drawing Sheets

(56) References Cited

U.S. PATENT DOCUMENTS

| | | | |
|---|---|---|---|
| 2009/0193203 A1* | 7/2009 | Brittain | G06F 13/4243 711/158 |
| 2010/0049936 A1* | 2/2010 | Lin | G06F 13/1605 711/169 |
| 2010/0058104 A1* | 3/2010 | Ishikawa | G06F 1/06 713/503 |
| 2012/0054419 A1* | 3/2012 | Chen | G06F 11/1441 711/103 |
| 2013/0051154 A1* | 2/2013 | Michael | G11C 16/26 365/185.21 |
| 2013/0166832 A1* | 6/2013 | Peng | G06F 13/1689 711/103 |
| 2013/0185584 A1* | 7/2013 | Hirairi | G06F 1/12 713/502 |
| 2014/0095819 A1* | 4/2014 | Ono | G06F 3/061 711/162 |
| 2014/0215130 A1* | 7/2014 | Chen | G06F 12/0246 711/103 |
| 2014/0344597 A1* | 11/2014 | Thumma | G06F 1/324 713/222 |

OTHER PUBLICATIONS

"Office Action of Taiwan Counterpart Application", issued on Oct. 21, 2015, p. 1-p. 8.

* cited by examiner

MEMORY CONTROLLING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 102139739, filed on Nov. 1, 2013. The entirety of the above-mentioned patent application is hereby incorporated by reference herein and made a part of this specification.

BACKGROUND

1. Technical Field

The invention relates to a memory controlling method, and more particularly, to a memory controlling method, a memory storage device and a memory controlling circuit unit for a rewritable non-volatile memory module.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

Generally, the rewritable non-volatile memory module is controlled by a memory controlling circuit unit. The memory controlling circuit unit may provide a clock signal to the rewritable non-volatile memory module, so that the rewritable non-volatile memory module may operate according to the clock signal. When a frequency of the clock signal gets higher, an operation speed of the rewritable non-volatile memory module may be higher, such that probabilities of having errors for some operations (e.g., writing) may also be increased, resulting in irreversible errors. However, when the frequency of the clock signal gets lower, the operation speed of the rewritable non-volatile memory module may also be lower. Accordingly, how to improve the operation speed while decreasing the probabilities of having errors for some operations has became one of the major subjects in the industry for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a memory controlling method, a memory storage device and a memory controlling circuit unit, capable of increasing an operation speed of the rewritable non-volatile memory module and decreasing probabilities of having errors for some operations.

A memory controlling method is provided according to an exemplary embodiment of the invention, which is used for a rewritable non-volatile memory module. The method includes: providing a first clock signal to a rewritable non-volatile memory module and reading a first data in the rewritable non-volatile memory module according to the first clock signal; and providing a second clock signal to the rewritable non-volatile memory module and writing a second data into the rewritable non-volatile memory module according to the second clock signal. A frequency of the second clock signal is different from a frequency of the first clock signal.

A memory storage device is provided according to an exemplary embodiment of the invention, which includes a connection interface unit, the rewritable non-volatile memory module described above and a memory controlling circuit unit. The connection interface unit is configured to couple to a host system. The memory controlling circuit unit is coupled to the connection interface unit and the rewritable non-volatile memory module, and configured to provide a first clock signal to the rewritable non-volatile memory module, and read a first data in the rewritable non-volatile memory module according to the first clock signal. The memory controlling circuit unit is also configured to provide a second clock signal to the rewritable non-volatile memory module and write a second data into the rewritable non-volatile memory module according to the second clock signal. A frequency of the second clock signal is different from a frequency of the first clock signal.

A memory controlling circuit unit is provided according to an exemplary embodiment of the invention, and configured to control the rewritable non-volatile memory module described above. The memory controlling circuit unit includes a host interface, a memory interface, a memory management circuit and a clock generating circuit. The host interface is configured to couple to a host system. The memory interface is configured to couple to the rewritable non-volatile memory module. The memory management circuit is coupled to the host interface and the memory interface. The clock generating circuit is configured to provide a first clock signal or a second clock signal to the rewritable non-volatile memory module. The memory management circuit is configured to read a first data in the rewritable non-volatile memory module according to the first clock signal. The memory management circuit is also configured to write a second data into the rewritable non-volatile memory module according to the second clock signal. A frequency of the second clock signal is different from a frequency of the first clock signal.

A memory controlling method is provided according to an exemplary embodiment of the invention, which is used for a rewritable non-volatile memory module. Physical programming units in the rewritable non-volatile memory module are divided into a data area, a spare area and a system area. The memory controlling method includes: providing a first clock signal to the rewritable non-volatile memory module, and executing a first operation to the data area or the spare area of the rewritable non-volatile memory module by applying the first clock signal; and providing a second clock signal to the rewritable non-volatile memory module, and executing a second operation to the data area or the spare area of the rewritable non-volatile memory module by applying the second clock signal. A frequency of the first clock signal is different from a frequency of the second clock signal.

A memory storage device is provided according to an exemplary embodiment of the invention, which includes a connection interface unit, the rewritable non-volatile memory module described above and a memory controlling circuit unit. The connection interface unit is configured to couple to a host system. The memory controlling circuit unit is coupled to the connection interface unit and the rewritable non-volatile memory module, and configured to provide a first clock signal to the rewritable non-volatile memory module, and execute a first operation to the data area or the spare area of the rewritable non-volatile memory module by applying the first clock signal. The memory controlling circuit unit is also configured to provide a second clock signal to the rewritable non-volatile memory module, and execute a second operation to the data area or the spare area of the rewritable non-volatile memory module by applying the second clock signal. A frequency of the first clock signal is different from a frequency of the second clock signal.

Based on above, the memory controlling method, the memory storage device and the memory controlling circuit unit proposed by the embodiments of the invention are capable of providing the clock signals in different frequencies to the rewritable non-volatile memory module. Accordingly, an operation speed of the rewritable non-volatile memory module may be increased under some situations and probabilities of having errors may be decreased under some other situations.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 1A:
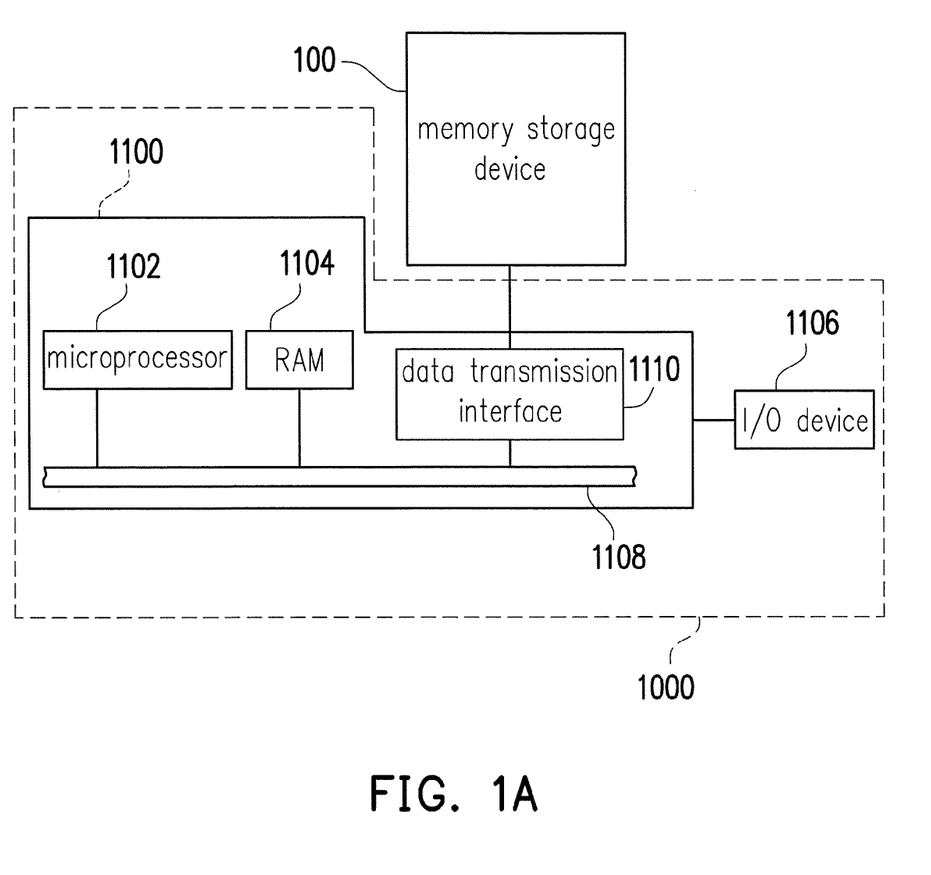
FIG. 1A illustrates a host system and a memory storage device according to an exemplary embodiment.
Figure 1B:
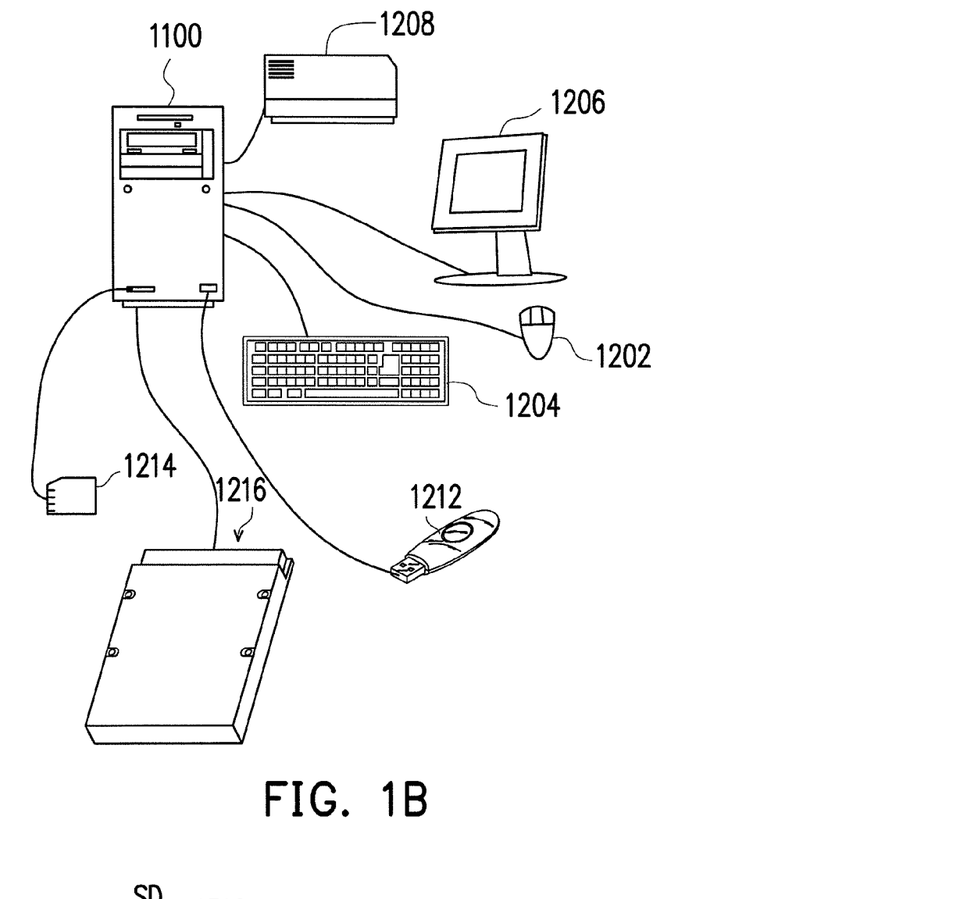
FIG. 1B is a schematic diagram illustrating a computer, an input/output device and a memory storage device according to an exemplary embodiment.
Figure 1C:
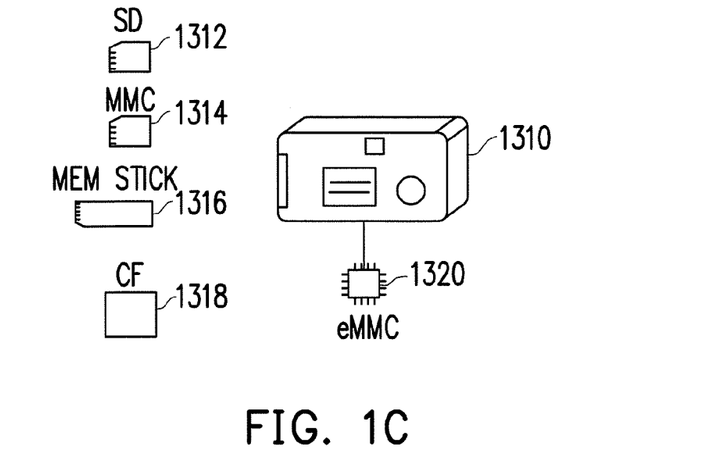
FIG. 1C is a schematic diagram illustrating a host system and a memory storage device according to an exemplary embodiment.

FIG. 1A illustrates a host system and a memory storage device according to an exemplary embodiment. FIG. 1B is a schematic diagram illustrating a computer, an input/output device and a memory storage device according to an exemplary embodiment. FIG. 1C is a schematic diagram illustrating a host system and a memory storage device according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the embodiment of the invention, the memory storage device 100 is coupled to the devices of the host system 1000 through the data transmission interface 1110. By using the microprocessor 1102, the random access memory (RAM) 1104 and the Input/Output (I/O) device 1106, data may be written to the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 1B.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is directly coupled to a substrate of the host system.

Figure 2:
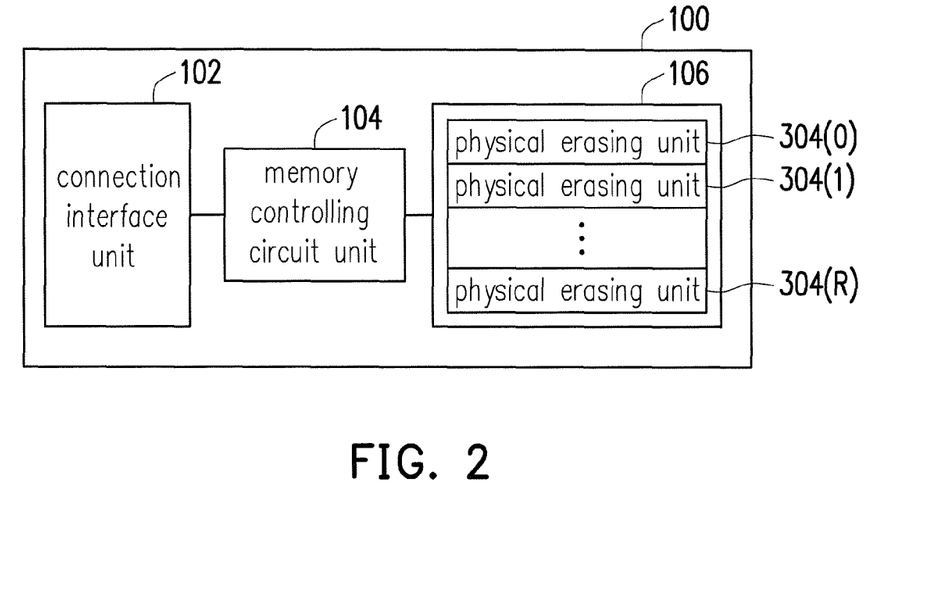
FIG. 2 is a schematic block diagram illustrating the memory storage device depicted in FIG. 1A.

FIG. 2 is a schematic block diagram illustrating the memory storage device depicted in FIG. 1A.

Referring to FIG. 2, the memory storage device 100 includes a connection interface unit 102, a memory controlling circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host 1000.

The rewritable non-volatile memory storage module 106 is coupled to the memory controlling circuit unit 104 and configured to store data written from the host system 1000. The rewritable non-volatile memory storage module 106 has multiple physical erasing units 304(0) to 304(R). For example, the physical erasing units 304(0) to 304(R) may belong to the same memory die or belong to different memory dies. Each physical erasing unit has a plurality of physical programming units, and the physical programming units of the same physical erasing unit may be written separately and erased simultaneously. For example, each physical erasing unit is composed by 128 physical programming units. Nevertheless, it should be understood that the invention is not limited thereto. Each physical erasing unit is composed by 64 physical programming units, 256 physical programming units or any amount of the physical programming units.

More specifically, each of the physical programming units includes a plurality of word lines and a plurality of bit lines, and a memory cell is disposed at an intersection of each of the word lines and each of the data lines. Each memory cell can store one or more bits. All of the memory cells in the same physical erasing unit are removed together. In the present exemplary embodiment, the physical erasing unit is a minimum unit for erasing. Namely, each physical erasing unit contains the least number of memory cells to be erased together. For instance, the physical erasing unit is a physical block. Furthermore, the memory cells on the same word line can be grouped into one or more of the physical programming units. In case each of the memory cells may store more than two bits, the physical programming units on the same word line may be classified into a lower physical programming unit and an upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundancy bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention.

In the present exemplary embodiment, a rewritable non-volatile memory module 106 is a Multi Level Cell (MLC) NAND flash memory module which stores at least 2 bits in one cell. The rewritable non-volatile memory module 106 may also be a Single Level Cell (SLC) NAND flash memory module, a Trinary Level Cell (TLC) NAND flash memory module, other flash memory modules or any memory module having the same features.

In the present exemplary embodiment, the memory controlling circuit unit 104 is coupled to the rewritable non-volatile memory module 106 through a plurality of channels. Each of the channels is coupled to a part of the physical erasing units 304(0) to 304(0). Operations on the channels are independent from one another. For instance, the memory controlling circuit unit 104 may perform a write operation on one channel while performing a read operation on another channel. However, a number of the channel and each channel being coupled to which physical erasing units are not limited in the invention. In another exemplary embodiment, only one channel is provided between the memory controlling circuit unit 104 and the rewritable non-volatile memory module 106, but the invention is not limited thereto.

Figure 3:
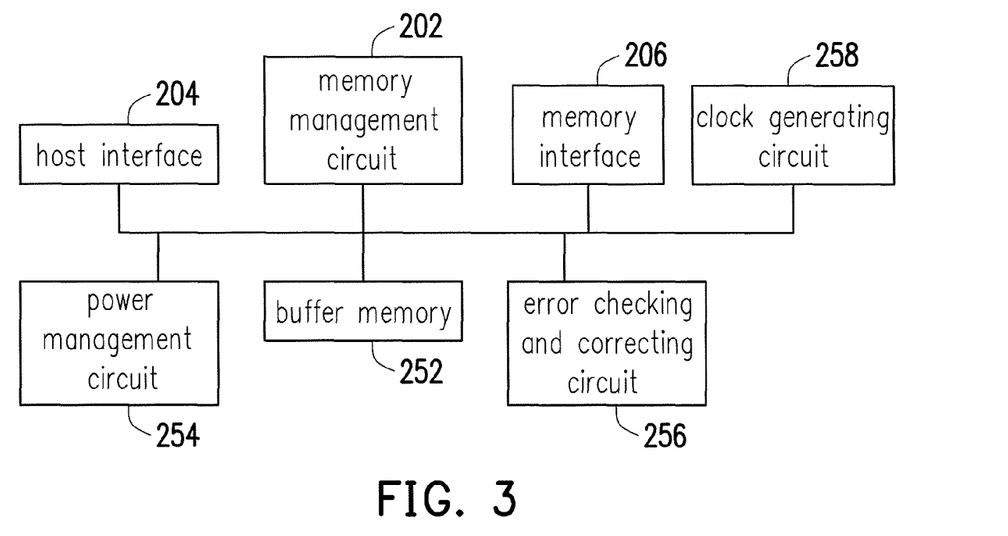
FIG. 3 is a schematic block diagram illustrating a memory controlling circuit unit according to an exemplary embodiment.

FIG. 3 is a schematic block diagram illustrating a memory controlling circuit unit according to an exemplary embodiment.

Referring to FIG. 3, the memory controlling circuit unit 104 includes a memory management circuit 202, a host interface 204 and a memory interface 206.

The memory management circuit 202 is configured to control overall operations of the memory controlling circuit unit 104. Specifically, the memory management circuit 202 has a plurality of control commands. When the memory storage device 100 operates, the control commands are executed to perform various operations such as data writing, data reading and data erasing. Operations of the memory management circuit 202 are similar to the operations of the memory controlling circuit unit 104, thus related description is omitted hereinafter.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory controlling circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 220 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a write command to the rewritable non-volatile memory module 106 in order to write data to the rewritable non-volatile memory module; the memory reading unit is configured to issue a read command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory controlling circuit unit 104 further includes a buffer memory 252, a power management circuit 254, an error checking and correcting circuit 256, and a clock generating circuit 258.

The buffer memory 252 is coupled to the memory management circuit 202 and configured to temporarily store data and commands from the host system 1000 or data from the rewritable non-volatile memory module 106.

The power management unit 254 is coupled to the memory management circuit 202 and configured to control the power of the memory storage device 100.

The error checking and correcting circuit 256 is coupled to the memory management circuit 202 and configured to perform an error checking and correcting process to ensure the correctness of data. Specifically, when the memory management circuit 202 receives a write command from the host system 1000, the error checking and correcting circuit 256 generates an error correcting code (ECC) for data corresponding to the write command, and the memory management circuit 202 writes data and the ECC corresponding to the write command to the rewritable non-volatile memory module 106. Subsequently, when the memory management circuit 202 reads the data from the rewritable non-volatile memory module 106, the corresponding ECC is also read from the rewritable non-volatile memory module 106, and the error checking and correcting circuit 256 executes the error checking and correcting procedure for the read data based on the ECC.

The clock generating circuit 258 is configured to generate a clock signal for the memory management circuit 202 to access the rewritable non-volatile memory module 106. More specifically, the clock signal generated by the clock generating circuit 258 may be provided to rewritable non-volatile memory module 106, and the rewritable non-volatile memory module 106 may execute the read operation, the write operation or other operations according to the clock signal. When a frequency of the provided clock signal gets higher, the operation speed of the rewritable non-volatile memory module 106 is also faster. In an exemplary embodiment, the clock signal generated by the clock generating circuit 258 may also be provided to other circuits in the memory controlling circuit unit 104, and said circuits may also be operated according to the clock signal. In the present exemplary embodiment, the clock generating circuit 258 may provide the clock signal having more than two different frequencies. For instance, the clock generating circuit 258 may include one or more oscillators such as a Hartley oscillator, a Colpitts oscillator, a Clapp oscillator, a phase-shift oscillator, a RC oscillator, a LC oscillator or oscillators of other types, but the inventions is not limited thereto.

Figure 4:
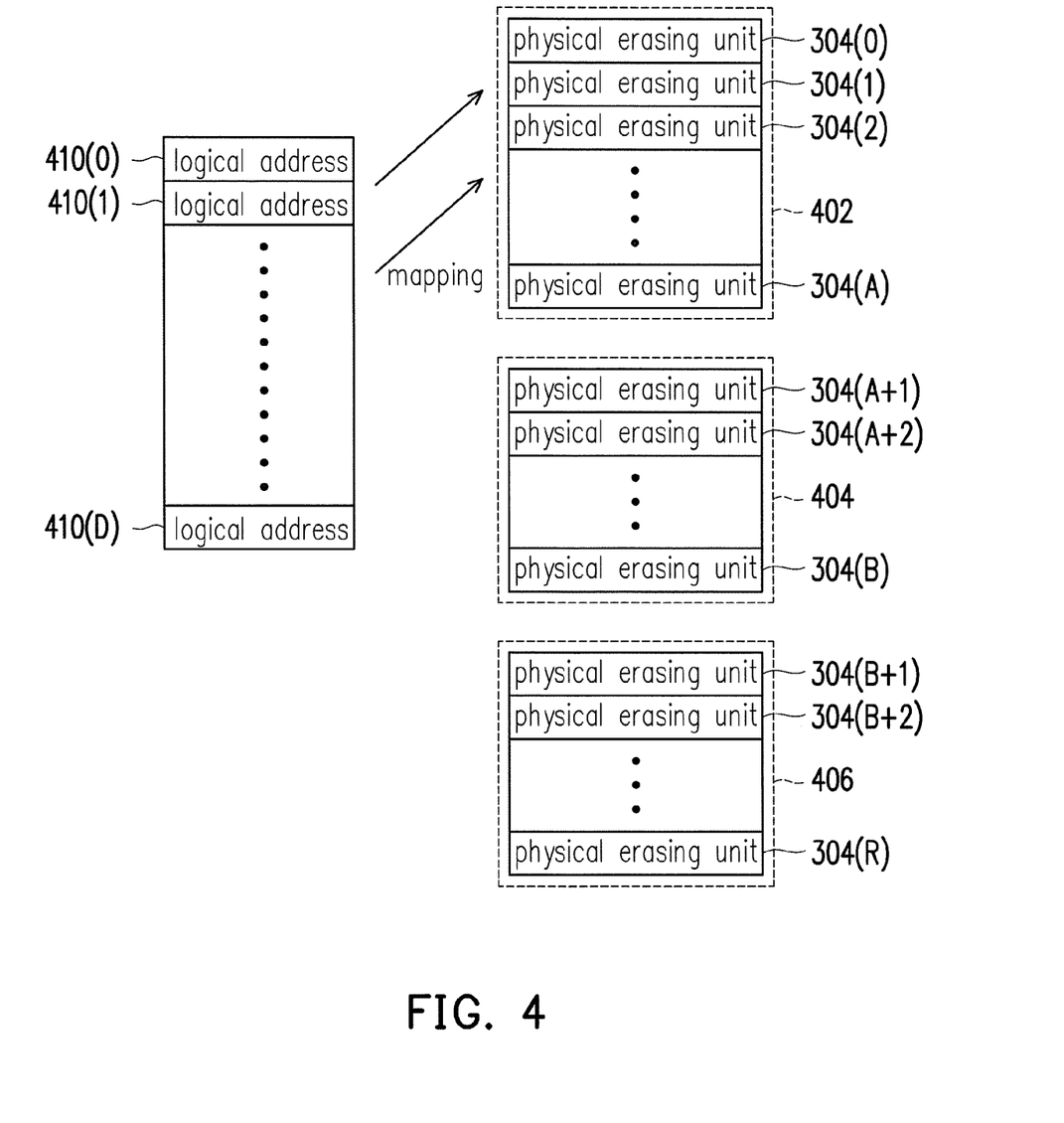
FIG. 4 is a schematic diagram illustrating an example for a management under a memory storage device according to an exemplary embodiment.

FIG. 4 is a schematic diagram illustrating an example for a management under a memory storage device according to an exemplary embodiment.

It should be understood that terms, such as "select", "divide", "relate" and so forth, are logical concepts which describe operations in the physical erasing units of the rewritable non-volatile memory module 106. That is, the physical erasing units of the rewritable non-volatile memory module are logically operated, but actual positions of the physical units of the rewritable non-volatile memory module are not changed.

Referring to FIG. 4, the memory management circuit 202 may logically divide the physical erasing units 304(0) to 304(R) of the rewritable non-volatile memory module 106 into a plurality of areas such as a data area 402, a spare area 404 and a system area 406. Namely, the physical programming units in the physical erasing units 304(0) to 340(0) are also divided into the data area 402, the spare area 404 and the system area 406.

The physical erasing units of the data area 402 are configured to store data from the host system 1000. The physical erasing units of the spare area 404 are configured as a buffer of the data area 402. For instance, when the host system 1000 intends to update the data in the data area 402, such data is first written in the spare area 404 before being moved to the data area 402 or merged with the data in the data area 402. Or, the physical erasing units in the spare area 404 may also be configured to replace the physical erasing units of the data area 402 and the system area 406. Namely, when the physical erasing units in the data area 402 and the system area 406 are damaged (i.e., becoming bad physical erasing units), the physical erasing units of the spare area 404 may be used to replace the bad physical erasing units. If no available physical erasing units are present in the spare area 404 when the physical erasing units are damaged, the memory storage device 100 is announced by the memory controlling circuit unit 104 as in a write protect status, and the data cannot be written therein. In another exemplary embodiment, the memory management circuit 202 may also divide another replacement area specifically stored with the physical erasing units for replacing the bad physical erasing units, but the invention is not limited thereto.

The physical erasing units of the system area 406 are configured to record system information which includes an ID number of the rewritable non-volatile memory module 106, a manufacturer and a model related to a memory chip, a capacity (a number of the physical erasing units) of the memory chip, a manufacturer information, a number of the physical programming units in each of the physical erasing units, or a related information provided to the host system 1000 for identifying an identification and a specification of the memory storage device 100 when the memory storage device 100 is connected to the host system 1000, and so forth. It should be noted that, said system information may not be stored in the data area 402 or the spare area 404.

The amount of the physical erasing units in the data area 402, the spare area 404 and the system area 406 may be different based on the different memory specifications. In addition, it should be understood that, during the operation of the memory storage device 100, grouping relations of the physical erasing units related to the data area 402, the spare area 404 and the system area 406 may be dynamically changed. For example, when the damaged physical erasing units in the data area 402 are replaced by the physical erasing units in the spare area 404, the physical erasing units originally from the spare area 404 are related to the data area 402.

The memory management circuit 202 may also be disposed with logical addresses 410(0) to 410(D) for mapping the physical erasing units 304(0) to 304(A) in the data area 402. The host system 1000 may access the data in the data area 402 through the logical addresses 410(0) to 410(D). In the present exemplary embodiment, one logical address is mapped to one physical storage unit (one physical storage unit represents one physical address, such as the physical sector), a logical programming unit is constituted by multiple logical addresses, and a logical erasing unit is constituted by multiple logical erasing units. One logical programming unit is mapped to one or more physical programming units, and one logical erasing unit is mapped to one or more physical erasing units.

In the present exemplary embodiment, the memory management circuit 202 manages the rewritable non-volatile memory module 106 by the logical erasing units, thus a physical address mapping table is established by the memory management circuit 202 for recording a mapping relation between the logical erasing units and the physical erasing units. In another exemplary embodiment, the memory management circuit 202 manages the rewritable non-volatile memory module 106 by the logical programming units, thus a physical address mapping table is established by the memory management circuit 202 for recording a mapping relation between the logical programming units and the physical programming units. Said physical address mapping table may be stored inside or outside the system area 406, but the invention is not limited thereto.

The logical addresses 410(0) to 410(D) are mapped to the physical storage units in the data area 402 or the spare area 404, but are not mapped to the physical storage units in the system area 406. From another prospective, in the present exemplary embodiment, the physical programming units in the system area 406 are not mapped to the logical address in a write command transmitted by the host system 1000. Namely, the physical programming units in the system area 406 are not mapped to the logical addresses 410(0) to 410(D) which are provided by the memory storage device 100 for the host system 1000, and the logical addresses 410(0) to 410(D) are the logical addresses in the address physical mapping table in the memory storage device 100.

When the host system 1000 intends to access the data in the rewritable non-volatile memory module 106, the host system 100 may issue a read command or a write command to the memory controlling circuit unit 104. According to the read command, the memory controlling circuit unit 104 reads the data in the rewritable non-volatile memory module 10, or writes the data into the rewritable non-volatile memory module 106. In addition, in case no command is issued by the host system 1000, the memory controlling circuit unit 104 may also access the rewritable non-volatile memory module 106, so as to execute a garbage collection, or access the data in the system area 406 for example. Particularly, under different situations, the memory controlling circuit unit 104 may provide the clock signals in different frequencies to the rewritable non-volatile memory module 106.

For instance, when the memory management circuit 202 intends to read the rewritable non-volatile memory module 106, the clock generating circuit 258 provides a first clock signal to the rewritable non-volatile memory module 106 and the memory management circuit 202, and the memory management circuit 202 reads a first data in the rewritable non-volatile memory module 106 according to the first clock signal. When the memory management circuit 202 intends to write a second data into the rewritable non-volatile memory module 106, the clock generating circuit 258 provides a second clock signal to the rewritable non-volatile memory module 106 and the memory management circuit 202, and the memory management circuit 202 writes the second data into the rewritable non-volatile memory module 106 according to the second clock signal. A frequency of the second clock signal is different from a frequency of the first clock signal. For example, the frequency of the second clock signal is lower than the frequency of the first clock signal. Therefore, when the first data is read, the rewritable non-volatile memory module 106 is operated under a higher frequency, so as to increase a reading speed. On the other hand, when the second data is written, the rewritable non-volatile memory module 106 is operated under a lower frequency, so that a probability of having errors during writing of the second data may be decreased. However, in another exemplary embodiment, the frequency of the second clock signal may also be higher than the frequency of the first clock signal, but the invention is not limited thereto.

In an exemplary embodiment, the reading or writing operations are instructed by the host system 1000. More specifically, the memory management circuit 202 may receive a first command from the host system 1000. The memory management circuit 202 then determines a type of the first command. If the first command is the read command, the clock generating circuit 258 provides the first clock signal, and the memory management circuit 202 reads the first data according to the first clock signal. If the first command is the write command, the clock generating circuit 258 provides the second clock signal, and the memory management circuit 202 writes the second data into the rewritable non-volatile memory module 106 according to the second clock signal. However, in another exemplary embodiment, the reading or writing operations are not instructed by the host system 1000. For example, when the garbage collection is executed (which is not instructed by the host system 1000), the memory management circuit 202 may also read or write some specific data. Whether the reading or writing operations are instructed by the host system 1000, or a source and a content of the first data and the second data are not particularly limited in the invention.

In an exemplary embodiment, the second clock signal having the lower frequency is used when an important data is read; whereas the first clock signal having the higher frequency is used when a less important data is read. For instance, the data stored in the system area 406 is relatively more important than the data stored in the data area 402. In an exemplary embodiment, the first data is stored in the data area 402, and when the memory management circuit 202 intends to read the first data in the data area 402, the memory management circuit 202 reads the data by applying the first clock signal have the higher frequency. However, when the memory management circuit 202 intends to read a third data (e.g., the physical address mapping table) stored in the system area 406, the clock generating circuit 258 provides the second clock signal to the rewritable non-volatile memory module 106, and the memory management circuit 202 reads the third data in the system area 406 according to the second clock signal. Accordingly, the probability of having errors when reading the important data may be decreased.

In an exemplary embodiment, when a read error event occurs, the memory management circuit 202 may repeatedly execute the reading operation. When the first clock signal having the higher frequency is applied to read the first data, the memory management circuit 202 may further calculate a total number of read error events, and whether to change to reading the first data by applying the second clock signal having the lower frequency is determined according to the total number of read error events. More specifically, when the first data is written into the rewritable non-volatile memory module 106, the error checking and correcting circuit 256 may generate an error correcting code or an error detection code (EDC), correspondingly. The error correcting code or the error detection code may be a hamming code, a low density parity code (LDPC), a turbo code, a Reed-solomon code (RS code), a BCH code, or codes using other algorithms, but the invention is not limited thereto. The memory management circuit 202 may write the error correcting code or the error detection code into the rewritable non-volatile memory module 106. When the first data is read, the memory management circuit 202 also reads the error correcting code and the error detection code together. The error checking and correcting circuit 256 determines whether the first data includes one or more error bits according to the error correcting code and the error detection code (i.e. determines whether the first data is correct or valid). For instance, the error checking and correcting circuit 256 may first determine whether the first data includes one or more error bits according to the error correcting code. If it is determined that the first data does not include the error bits according to the error correcting code, the error checking and correcting circuit 256 then determines whether the first data includes one or more error bits according to the error detection code. If the first data includes one or more error bits, the memory management circuit 202 determines whether the total number of read error event matches a threshold condition (e.g., greater than a threshold value). If the first data includes one or more error bits and the total number of read error events does not match the threshold condition (e.g., less than the threshold value), the memory management circuit 202 re-reads the first data according to the first clock signal and updates the total number of read error events (e.g., added by 1). Namely, the total number of read error events also represents the number of times for reading the first data. If the first data includes one or more error bits and the total number of read error events matches the threshold condition, the clock generating circuit 258 provides the second clock signal having the lower frequency to the rewritable non-volatile memory module 106, and the memory management circuit 202 reads the first data according to the second clock signal, so as to decrease a probability of having read error events.

In an exemplary embodiment, the memory management circuit records the total number of the read error events correspondingly for each of the channels coupled between the rewritable non-volatile memory module 106 and the memory controlling circuit unit 104. Accordingly, the total number of read error events also indicate whether the corresponding channel is prone to the read error events. In the channel which is prone to the read error events, the memory controlling circuit unit 104 may read the data by applying the second clock signal having the lower frequency. Meanwhile, in other channels, the data may be read by using the first clock signal having the higher frequency.

Figure 5:
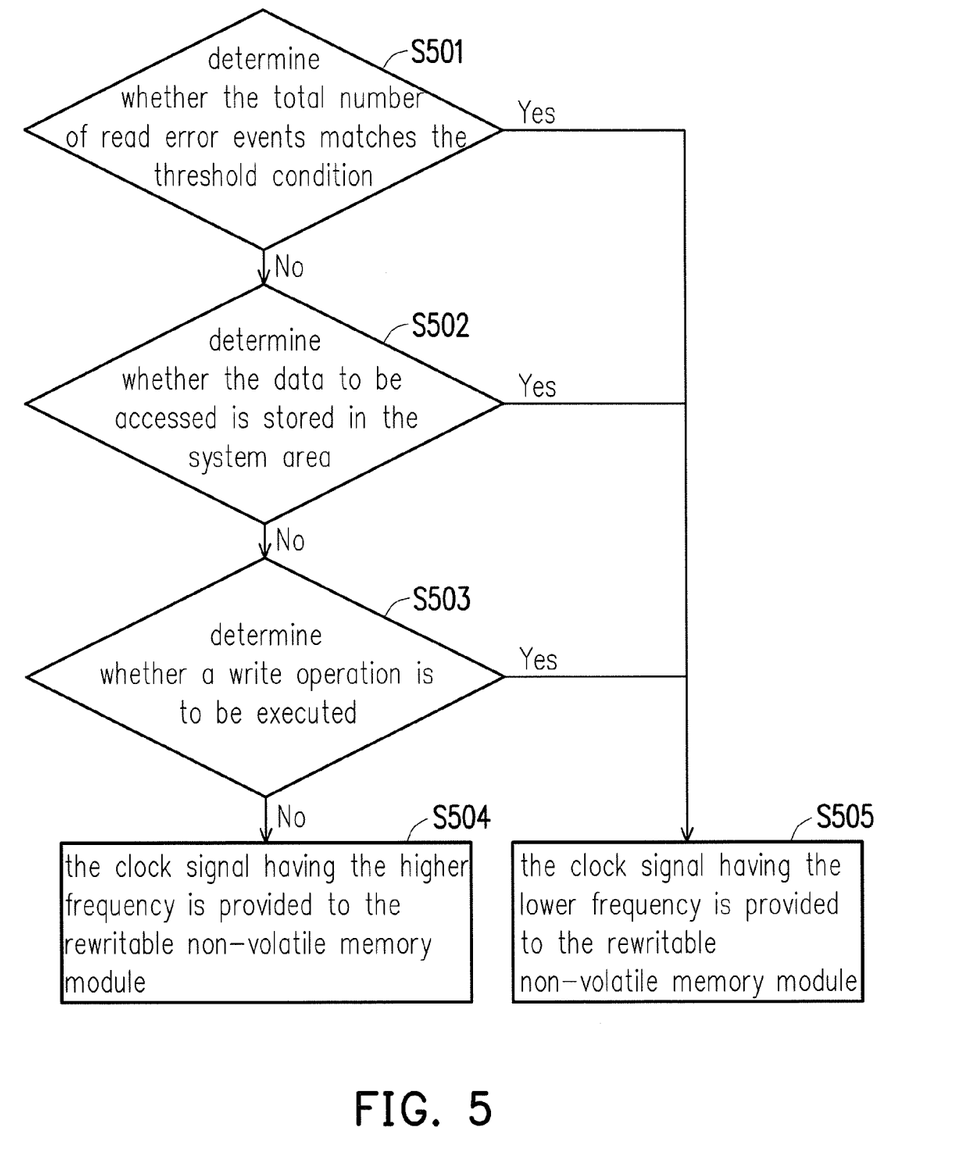
FIG. 5 is a flowchart for determining whether to use the first clock signal or the second clock signal according to an exemplary embodiment.

The steps of determining whether to apply the first clock signal or the second clock signal as described above may also be freely combined. For instance, FIG. 5 is a flowchart for determining whether to use the first clock signal or the second clock signal according to an exemplary embodiment. Referring to FIG. 5, in step S501, whether the total number of read error events matches the threshold condition is determined. If the total number of read error events matches the threshold condition, proceeding to step S505. If the total number of read error events does not match the threshold condition, whether the data to be accessed is stored in the system area 406 is determined in step S502. If the data to be accessed is stored in the system area 406, proceeding to step S505. If the data to be accessed is not stored in the system area 406, whether a write operation is to be executed is determined in step S503. If it is the write operation to be executed, proceeding to step S505. If it is not the write operation to be executed, proceeding to step S504, in which the clock signal having the higher frequency is provided to the rewritable non-volatile memory module 106. In step S505, the clock signal having the lower frequency is provided to the rewritable non-volatile memory module 106. However, a manner of combining steps S501 to S503 is not particularly limited in the invention.

Second Exemplary Embodiment

Hereinafter, some differences between second embodiment and first embodiment are described below. Referring back to FIG. 4, in second exemplary embodiment, the clock generating circuit 258 may provide the first clock signal or the second clock signal to the rewritable non-volatile memory module 106. However, the memory management circuit 202 may execute a first operation to the data area 402 or the spare area 404 by applying the first clock signal, and execute a second operation to the data area 402 or the spare area 404 by applying the second clock signal. The first operation may be identical to or different from the second operation. In addition, the first operation and the second operation may be executed according to the commands issued by the host system 1000, or may be executed by the memory management circuit 202 itself, and the invention is not limited thereto. Nonetheless, the frequency of the first clock signal is different from the frequency of the second clock signal. For instance, the frequency of the second clock signal is lower than the frequency of the first clock signal.

In an exemplary embodiment, the first operation is a read operation, and the second operation is a write operation. In another exemplary embodiment, the physical address mapping table is stored in the physical erasing units in the spare area 404, the first operation is configured to read a user data stored in the data area 402 or the spare area 404, and the second operation is configured to read the physical address mapping table in the spare area 404.

In an exemplary embodiment, the first operation is configured to read the first data in the data area 402 or the spare area 404, and the second operation is configured to re-read the first data when the first data includes one or more error bits. More specifically, after the first clock signal is applied to read the first data, the memory management circuit 202 may determine whether the first data includes one or more error bits according to the error correcting code or the error detection code. If it is determined that first data includes one or more error bits according to the error correcting code or the error detection code, the memory management circuit may execute the second operation, so as to re-read the first data by applying the second clock signal.

In view of above, the memory controlling method, the memory storage device and the memory controlling circuit unit proposed by the embodiments of the invention are capable of providing the clock signals in different frequencies to the rewritable non-volatile memory module based on different situations. Accordingly, an operation speed of the rewritable non-volatile memory module may be increased, or probabilities of having errors for some operations may be decreased.

The previously described exemplary embodiments of the present invention have the advantages aforementioned, wherein the advantages aforementioned not required in all versions of the invention.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory controlling method for a rewritable non-volatile memory module, comprising:
   receiving a first command from a host system;
   if the first command is a read command, providing a first clock signal to the rewritable non-volatile memory module, and reading a first data in the rewritable non-volatile memory module operated in a frequency of the first clock signal according to the first clock signal; and
   if the first command is a write command, providing a second clock signal to the rewritable non-volatile memory module, and writing a second data into the rewritable non-volatile memory module operated at a frequency of the second clock signal according to the second clock signal, wherein the frequency of the second clock signal is different from the frequency of the first clock signal.

2. The memory controlling method of claim 1, wherein the frequency of the second clock signal is lower than the frequency of the first clock signal.

3. The memory controlling method of claim 1, wherein the rewritable non-volatile memory module comprises a plurality of physical erasing units, and the physical erasing units are at least divided into a data area and a system area, the first data is stored in the data area, and the memory controlling method further comprises:
   providing the second clock signal to the rewritable non-volatile memory module, and reading a third data in the system area according to the second clock signal.

4. The memory controlling method of claim 1, further comprising:
   determining whether the first data includes one or more error bits according to an error correcting code or an error detection code, and determining whether a total number of read error events matches a threshold condition;
   if the first data includes the one or more error bits and the total number of the read error events does not match the threshold condition, re-reading the first data according to the first clock signal and updating the total number of the read error events;
   if the first data includes the one or more error bits and the total number of the read error events matches the threshold condition, providing the second clock signal to the rewritable non-volatile memory module, and reading the first data according to the second clock signal.

5. The memory controlling method of claim 4, wherein the step of determining whether the first data includes the one or more error bits according to the error correcting code or the error detection code comprises:
   determining whether the first data includes the one or more error bits according to the error correcting code; and
   if it is determined that the first data does not include the one or more error bits according to the error correcting code, determining whether the first data includes the one or more error bits according to the error detection code.

6. The memory controlling method of claim 4, wherein the rewritable non-volatile memory module is coupled to a plurality of channels, and the memory controlling method further comprises:
   recording the total number of read error events correspondingly for each of the channels.

7. A memory storage device, comprising:
   a connection interface unit configured to couple to a host system;
   a rewritable non-volatile memory module comprising a plurality of physical erasing units; and
   a memory controlling circuit unit coupled to the connection interface unit and the rewritable non-volatile memory module, and configured to receive a first command from the host system,
   wherein if the first command is a read command, the memory controlling circuit unit is configured to provide a first clock signal to the rewritable non-volatile memory module, and read a first data in the rewritable non-volatile memory module operated in a frequency of the first clock signal according to the first clock signal,
   wherein if the first command is the write command, the memory controlling circuit unit is configured to provide a second clock signal to the rewritable non-volatile memory module, and write a second data into the rewritable non-volatile memory module operated in a frequency of the first clock signal according to the second clock signal, wherein the frequency of the second clock signal is different from the frequency of the first clock signal.

8. The memory storage device of claim 7, wherein the frequency of the second clock signal is lower than the frequency of the first clock signal.

9. The memory storage device of claim 7, wherein the physical erasing units are at least divided into a data area and a system area, the first data is stored in the data area, and the memory controlling circuit unit is further configured to provide the second clock signal to the rewritable non-volatile memory module, and read a third data in the system area according to the second clock signal.

10. The memory storage device of claim 7, wherein the memory controlling circuit unit is further configured to determine whether the first data includes one or more error bits according to an error correcting code or an error detection code, and determine whether a total number of read error events matches a threshold condition, wherein if the first data includes the one or more error bits and the total number of the read error events does not match the threshold condition, the memory controlling circuit unit is configured to re-read the first data according to the first clock signal and update the total number of the read error events, wherein if the first data includes the one or more error bits and the total number of the read error events matches the threshold condition, the memory controlling circuit unit is configured to provide the second clock signal to the rewritable non-volatile memory module, and read the first data according to the second clock signal.

11. The memory storage device of claim 10, wherein the operation that memory controlling circuit unit determines whether the first data includes the one or more error bits according to the error correcting code or the error detection code comprises:

the memory controlling circuit unit determines whether the first data includes the one or more error bits according to the error correcting code, if it is determined that the first data does not include the one or more error bits according to the error correcting code, the memory controlling circuit unit determines whether the first data includes the one or more error bits according to the error detection code.

12. The memory storage device of claim 10, wherein the rewritable non-volatile memory module is coupled to the memory controlling circuit unit through a plurality of channels, and the memory controlling circuit unit is further configured to record the total number of the read error events correspondingly for each of the channels.

13. A memory controlling circuit unit, for a rewritable non-volatile memory module, wherein the rewritable non-volatile memory module comprises a plurality of physical erasing units, and the memory controlling circuit unit comprises:

a host interface configured to couple to a host system;
a memory interface configured to couple to the rewritable non-volatile memory module;
a memory management circuit coupled to the host interface and the memory interface, and configured to receive a first command from the host system; and
a clock generating circuit configured to provide a first clock signal or a second clock signal to the rewritable non-volatile memory module,
wherein if the first command is a read command, the memory management circuit is configured to read a first data in the rewritable non-volatile memory module operated in a frequency of the first clock signal according to the first clock signal,
wherein if the first command is a write command, the memory management circuit is configured to write a second data into the rewritable non-volatile memory module operated in a frequency of the second clock signal according to the second clock signal, wherein the frequency of the second clock signal is different from the frequency of the first clock signal.

14. The memory controlling circuit unit of claim 13, wherein the frequency of the second clock signal is lower than the frequency of the first clock signal.

15. The memory controlling circuit unit of claim 13, wherein the physical erasing units are at least divided into a data area and a system area, the first data is stored in the data area, and the memory management circuit is further configured to read a third data in the system area according to the second clock signal.

16. The memory controlling circuit unit of claim 13, wherein the memory management circuit is further configured to determine whether the first data includes one or more error bits according to an error correcting code or an error detection code, and determine whether a total number of read error events matches a threshold condition, wherein if the first data includes the one or more error bits and the total number of the read error events does not match the threshold condition, the memory management circuit is configured to re-read the first data and update the total number of the read error events according to the first clock signal, wherein if the first data includes the one or more error bits and the total number of the read error events matches the threshold condition, the memory management circuit is configured to read the first data according to the second clock signal.

17. The memory controlling circuit unit of claim 16, wherein the operation that the memory management circuit determines whether the first data includes the one or more error bits according to the error correcting code or the error detection code comprises:

the memory management circuit determines whether the first data includes the one or more error bits according to the error correcting code, if it is determined that the first data does not include the one or more error bits according to the error correcting code, the memory management circuit determines whether the first data includes the one or more error bits according to the error detection code.

18. The memory controlling circuit unit of claim 16, wherein the rewritable non-volatile memory module is coupled to the memory controlling circuit unit through a plurality of channels, and the memory management circuit is further configured to record the total number of the read error events correspondingly for each of the channels.

19. A memory controlling method for a rewritable non-volatile memory module, wherein the rewritable non-volatile memory module comprises a plurality of physical programming units, the physical programming units are divided into a system area, a data area and spare area, and the memory controlling method comprises:

providing a first clock signal to the rewritable non-volatile memory module, and executing a first operation to the data area or the spare area of the rewritable non-volatile memory module operated at a frequency of the first clock signal by applying the first clock signal; and providing a second clock signal to the rewritable non-volatile memory module, and executing a second operation to the data area or the spare area of the rewritable non-volatile memory module operated at a frequency of the second clock signal by applying the second clock signal, wherein the frequency of the first clock signal is different from the frequency of the second clock signal, wherein the frequency of the second clock signal is lower than the frequency of the first clock signal, the first operation is configured to read a first data, and the second operation is configured to re-read the first data when the first data includes one or more error bits.

20. The memory controlling method of claim 19, wherein the frequency of the second clock signal is lower than the frequency of the first clock signal, the first operation is a read operation, and the second operation is a write operation.

21. The memory controlling method of claim 19, wherein the frequency of the second clock signal is lower than the frequency of the first clock signal, the first operation is configured to read a user data, and the second operation is configured to read a physical address mapping table.

22. The memory controlling method of claim 19, wherein a system data of the rewritable non-volatile memory module is not stored in the data area or the spare area, and the physical programming units in the system area are not mapped to logical addresses in a physical address mapping table in the rewritable non-volatile memory module.

23. A memory storage device, comprising:
a connection interface unit configured to couple to a host system;
a rewritable non-volatile memory module comprising a plurality of physical programming units; and
a memory controlling circuit unit coupled to the connection interface unit and the rewritable non-volatile memory module, and dividing the physical programming units into a data area, a spare area, and a system area,
wherein the memory controlling circuit unit is configured to provide a first clock signal to the rewritable non-volatile memory module, and execute a first operation to the data area or the spare area of the rewritable non-volatile memory module operated at a frequency of the first clock signal by applying the first clock signal,
wherein the memory controlling circuit unit is configured to provide a second clock signal to the rewritable non-volatile memory module, and execute a second operation to the data area or the spare area of the rewritable non-volatile memory module operated at a frequency of the second clock signal by applying the second clock signal,
wherein the frequency of the first clock signal is different from the frequency of the second clock signal,
wherein the frequency of the second clock signal is lower than the frequency of the first clock signal, the first operation is configured to read a first data, and the second operation is configured to re-read the first data when the first data includes one or more error bits.

24. The memory storage device of claim 23, wherein the frequency of the second clock signal is lower than the frequency of the first clock signal, the first operation is a read operation, and the second operation is a write operation.

25. The memory storage device of claim 23, wherein the frequency of the second clock signal is lower than the frequency of the first clock signal, the first operation is configured to read a user data, and the second operation is configured to read a physical address mapping table.

26. The memory storage device of claim 23, wherein a system data of the rewritable non-volatile memory module is not stored in the data area or the spare area, and the physical programming units in the system area are not mapped to logical addresses in a physical address mapping table in the memory storage device.

* * * * *